(12) United States Patent
Kim et al.

(10) Patent No.: US 12,287,712 B2
(45) Date of Patent: Apr. 29, 2025

(54) FAILOVER METHODS AND SYSTEMS IN THREE-DIMENSIONAL MEMORY DEVICE

(71) Applicant: Rambus Inc., San Jose, CA (US)

(72) Inventors: Joohee Kim, Sunnyvale, CA (US); Dongyun Lee, Sunnyvale, CA (US)

(73) Assignee: Rambus Inc., San Jose, CA (US)

( * ) Notice: Subject to any disclaimer, the term of this patent is extended or adjusted under 35 U.S.C. 154(b) by 255 days.

(21) Appl. No.: 18/059,900

(22) Filed: Nov. 29, 2022

(65) Prior Publication Data

US 2023/0176953 A1 Jun. 8, 2023

Related U.S. Application Data

(60) Provisional application No. 63/303,623, filed on Jan. 27, 2022, provisional application No. 63/286,799, filed on Dec. 7, 2021.

(51) Int. Cl.
| | | |
|---|---|---|
| G11C 11/4093 | (2006.01) | |
| G06F 11/20 | (2006.01) | |
| G11C 29/00 | (2006.01) | |
| H01L 23/00 | (2006.01) | |
| H01L 25/065 | (2023.01) | |

(52) U.S. Cl.
CPC ........ *G06F 11/2028* (2013.01); *G11C 29/816* (2013.01); *H01L 24/16* (2013.01); *H01L 24/32* (2013.01); *H01L 25/0657* (2013.01); *H01L 2224/32145* (2013.01); *H01L 2225/06513* (2013.01); *H01L 2225/06517* (2013.01); *H01L 2924/15311* (2013.01)

(58) Field of Classification Search
CPC ... G06F 11/2028; G11C 29/816; H01L 24/16; H01L 24/32; H01L 25/0657; H01L 2224/32145; H01L 2225/06513; H01L 2225/06517; H01L 2924/15311
See application file for complete search history.

(56) References Cited

U.S. PATENT DOCUMENTS

| | | | |
|---|---|---|---|
| 8,897,053 B1 * | 11/2014 | Stephens, Jr. ............ | G11C 5/02 365/194 |
| 11,081,474 B1 * | 8/2021 | Hoang .................. | G11C 16/26 |
| 2017/0069369 A1 * | 3/2017 | Kim .................... | H01L 25/0657 |
| 2017/0146598 A1 * | 5/2017 | Kim ........................ | G11C 29/00 |

(Continued)

OTHER PUBLICATIONS

Global Semiconductor Alliance, "Electrostatic Dischrge (ESD) in 3D-IC Packages," whitepaper version 1.0, Jan. 14, 2015, 39 pages.

(Continued)

*Primary Examiner* — Kurtis R Bahr
(74) *Attorney, Agent, or Firm* — Silicon Edge Law Group LLP; Arthur J. Behiel

(57) ABSTRACT

Described are memory systems and devices in which each memory die in a three-dimensional stack of memory dies includes drive and receive circuitry that can communicate data signals from the stack on behalf of all the memory dies in the stack. The drive and receive circuitry, if defective on one device in the stack, can be disabled and substituted with the drive and receive circuitry from another. The stack of memory dies can thus function despite a failure of drive or receive circuitry in one or more of the memory dies. Each memory die includes test circuitry to detect defective drive and receive circuitry.

19 Claims, 3 Drawing Sheets

(56) References Cited

U.S. PATENT DOCUMENTS

| | | | |
|---|---|---|---|
| 2018/0095127 A1* | 4/2018 | Pappu | H03K 19/1776 |
| 2020/0111764 A1* | 4/2020 | Kim | G11C 5/025 |
| 2020/0135262 A1* | 4/2020 | Ware | G11C 17/18 |
| 2021/0173773 A1 | 6/2021 | Pearson et al. | |
| 2021/0384164 A1* | 12/2021 | Chen | H01L 24/85 |

OTHER PUBLICATIONS

Moyer, "Will Monolithic 3D DRAM Happen?" semiengineering.com/will-monolithic-3d-dram-happen, Sep. 9, 2021, 13 pages.
Wikipedia, "Three-dimensional integrated circuit," https://en.wikipedia.org/w/index.php?title=Three-dimensional_integrated_circuit&oldid=1060048107, last edited on Dec. 13, 2021, at 04:23 (UTC), 19 pages.

* cited by examiner

FAILOVER METHODS AND SYSTEMS IN THREE-DIMENSIONAL MEMORY DEVICE

BACKGROUND

Personal computers, workstations, and servers are general-purpose devices that can be programmed to automatically carry out arithmetic or logical operations. These devices include at least one processor, such as a central processing unit (CPU), and some form of memory system. The processor executes instructions and manipulates data stored in the memory.

Memory systems commonly include a memory controller that communicates with some number of memory modules via multi-wire physical connections called "channels." Each memory module commonly includes dynamic random-access memory (DRAM) components mounted on a printed circuit board. Successive generations of DRAM components have benefitted from steadily shrinking lithographic feature sizes, which increase the number of devices. Storage capacity and signaling rates have improved as a result. Feature-size reductions are growing increasingly difficult as device structures approach physical limitations.

The memory industry is addressing the problem of areal scaling by adding a third dimension to DRAM architectures. Three-dimensional stack DRAM (3DS DRAM) devices are integrated-circuit (IC) memory components manufactured by stacking silicon wafers or dies and interconnecting them vertically using e.g. through-silicon vias (TSVs) or copper-copper (Cu—Cu) connections so that the stack behaves as a single DRAM component. Unfortunately, the likelihood that a defective die will adversely affect a given memory device increases with the number of devices in the stack.

BRIEF DESCRIPTION OF THE FIGURES

The illustrations are by way of example, and not by way of limitation. Like reference numerals similar elements.

DETAILED DESCRIPTION

Figure 1:
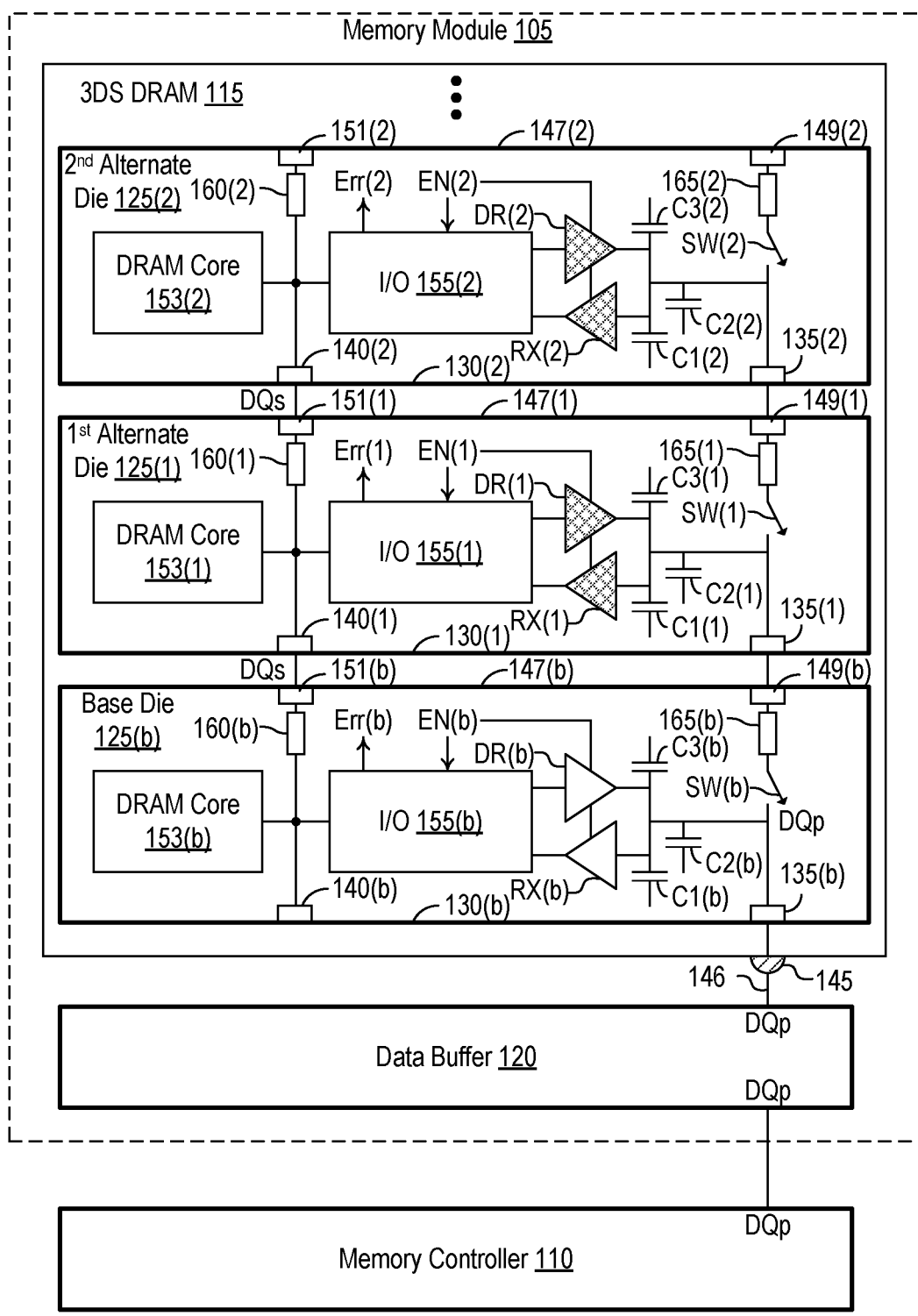
FIG. 1 depicts a memory system 100 in which a memory module 105 provides data storage to a memory controller 110.

FIG. 1 depicts a memory system 100 in which a memory module 105 provides data storage to a memory controller 110. Memory module 105 stores the data in a three-dimensional stack DRAM (3DS DRAM) device 115 and facilitates the communication of signals representing that data using a data buffer integrated circuit (IC) 120. 3DS DRAM device 115 includes a stack of identical DRAM dies 125, each one of which includes drive circuitry (driver) DR and receive circuitry (receiver) RX that can communicate write and read data signals from and to data buffer IC 120 on behalf of all dies 125 in the stack. 3DS DRAM device 115 can thus function despite a failure of drive circuitry DR or receive circuitry RX in one or more DRAM dies 125. DRAM dies 125 are identical in the depicted example. The lowermost die 125($b$) is the "base die," which is mounted directly to a printed-circuit board (PCB) or a package substrate. Base die elements are designated using a terminal "b". First and second alternate dies 125(1) and 125(2) are stacked atop base die 125($b$). Elements for these dies are distinguished using "1" and "2", respectively.

Base memory die 125($b$) includes a bottom base-die face 130($b$) with respective bottom base-die primary and secondary data contacts 135($b$) and 140($b$). In this context, descriptors of orientation and placement, like "bottom" and "top," are defined relative to the position of base die 125($b$) at the bottom of device 115. Primary data contact 135($b$) is electrically and physically connected to the PCB or a package substrate via e.g. solder 145 and is electrically connected to data buffer IC 120 via a corresponding trace 146. Secondary data contact 140($b$) has no external connection in this example. Base memory die 125($b$) also includes a top base-die face 147($b$) that extends through 3DS device 115 and has a top base-die primary data contact 149($b$) and a top base-die secondary data contact 151($b$). A base-die memory core 153($b$) stores data and is accessible to primary data contact 135($b$) via input/output (I/O) circuit 155($b$) and the respective driver/receiver (DR(b)/RX(b)) pair. A switchable connection SW(b) between bottom base-die primary data contact 135($b$) and top base-die primary data contact 149($b$) allows base die 125($b$) to convey data signals between data buffer IC 120 and first alternate die 125(1) to bypass I/O circuit 155($b$) or the driver/receiver pair DR(b)/RX(b) if any of those circuits are defective.

Base-die drive circuitry DR(b) has its input communicatively coupled to both the local DRAM core 153($b$) and top base-die secondary data contact 151($b$) via I/O circuit 155($b$) and its output to bottom base-die primary data contact 135($b$). This connection allows base die 125($b$) to read data from local and remote DRAM cores 153($b$,1,2 . . . ), aka DRAM cores 153(#), and convey the resultant read-data as primary data signals DQp to data buffer 120 via driver DR(b) and bottom base-die primary data contact 135($b$). Receiver RX(b) is connected similarly, albeit in the opposite direction, to convey write data as primary data signals DQp from data buffer 120 for storage in any of DRAM cores 153(#). Other data, timing, and control signals are omitted for brevity but can be communicated similarly.

The first and second alternate memory dies 125(1,2) are identical to base die 125($b$) in this example, though this need not be the case. In some embodiments, for example, each die 125(#) is thinned before inclusion into the stack, whereas in other embodiments the uppermost die is not. Die thinning desirably reduces device size and facilitates inter-die connectivity using through-silicon vias (TSVs). TSVs provide vertical electrical connections that pass completely through a silicon wafer or die. TSVs 160(#) extend through respective dies 125(#) to interconnect top and bottom secondary data contacts 151(#) and 140(#). TSVs 165(#) can also be used to establish the switched connections between top and bottom primary data contacts 149(#) and 135(#). Routing associated with one such embodiment is discussed below in connection with FIG. 3.

Staying with FIG. 1 and turning to first alternate memory die 125(1), bottom alternate-die face 130(1) extends through 3DS DRAM device 115 in physical contact with top base-die face 147($b$). The dies are shown separated for ease of illustration but are flush against one another in practice or microbumps are formed between dies to connect them electrically. Bottom alternate-die face 130(1) has a bottom alternate-die primary data contact 135(1) in contact with top base-die primary data contact 149(*b*) and a bottom alternate-die secondary data contact 140(1) in contact with top base-die secondary data contact 151(*b*). DRAM core 153(1) in this first alternate die 125(1) is coupled to local (same die) I/O circuit 155(1) and an identical I/O circuit 155(2,*b*) in each of the overlying second alternate die 125(2) and the underlying base die 125(*b*). This connectivity allows the I/O and drive circuitry in any memory die (e.g., I/O circuit 155(*b*) and DR(b)/RX(b) in base die 125(*b*)) to read from and write to any of DRAM cores 153(#).

While not shown, each I/O circuit 155(#) includes complex, high-performance circuitry to interface between and meet the disparate performance requirements for internal and external (primary and secondary) data connections, where "internal" and "external" are defined relative to memory device 115. Among the interface circuitry, a serializer/deserializer (SerDes) communicates serial data with data buffer 120 via the respective driver/receiver DR(#)/RX(#) pair and parallel secondary data DQs to DRAM cores 153(#). SerDes circuits are commonly used in high-speed communications. SerDes circuits can support sophisticated error-checking, timing-calibration, and equalization functions. SerDes complexity is growing to meet demands for ever greater efficiency and speed performance. Complexity can increase failure rates, however. The ability to substitute failing circuitry addresses this issue.

The example of FIG. 1 assumes the drive circuitry in base die 125(*b*) is functional. Enable signal EN(b) is asserted to enable I/O circuit 155(*b*) and driver/receiver pair DR(b)/RX (b). The bottom primary data contact 135(*b*) exhibits a capacitive load depicted as an input capacitance C1(*b*) of a sampler in receiver RX(b), a second capacitance C2(*b*) associated with an integrated electrostatic discharge (ESD) protection device (not shown), and an output capacitance C3(*b*) of driver DR(b). Opening switch SW(b) isolates the node common to primary data contact 135(*b*) and those capacitances from similar nodes in overlying dies (e.g., capacitances C1(1), C2(1), and C3(1) in alternate die 125 (1)), which might otherwise reduce the data rate for primary data contact 135(*b*). Enable signals EN(2,1) in the alternate dies are deasserted to save power, in which case switches SW(2,1) are open to reduce capacitance load. Driver/receiver pairs DR(2,1)/RX(2,1) are shaded to illustrate their disability. 3DS DRAM device 115 uses driver/receiver pair DR(b)/RX(b) to communicate serial data signals DQp with data buffer 120 and parallel data signals DQs with all of DRAM cores 153(#).

Memory controller 110 can test 3DS DRAM device 115 to identify memory-core failures. Should one of DRAM cores 153(#) fail, controller 110 can disable the defective core or die. TSVs 160(#) and 165(#) can likewise be scanned and defects attended to by routing around defective TSVs in favor of redundant resources (not shown) that can be integrated for this purpose. Base-die I/O circuitry, e.g. I/O circuit 155(*b*) and driver/receiver pair DR(b)/RX(b), can be tested using built-in self-test (BIST) or via an external scan. If the base-die I/O is found to be failing, such as by generating error signals Err(b) during BIST, the base-die I/O can be disabled and substituted with an alternative-die I/O, such as I/O circuit 155(1) and driver/receiver pair DR(1)/RX(1) of first alternative memory die 125(1).

Figure 2:
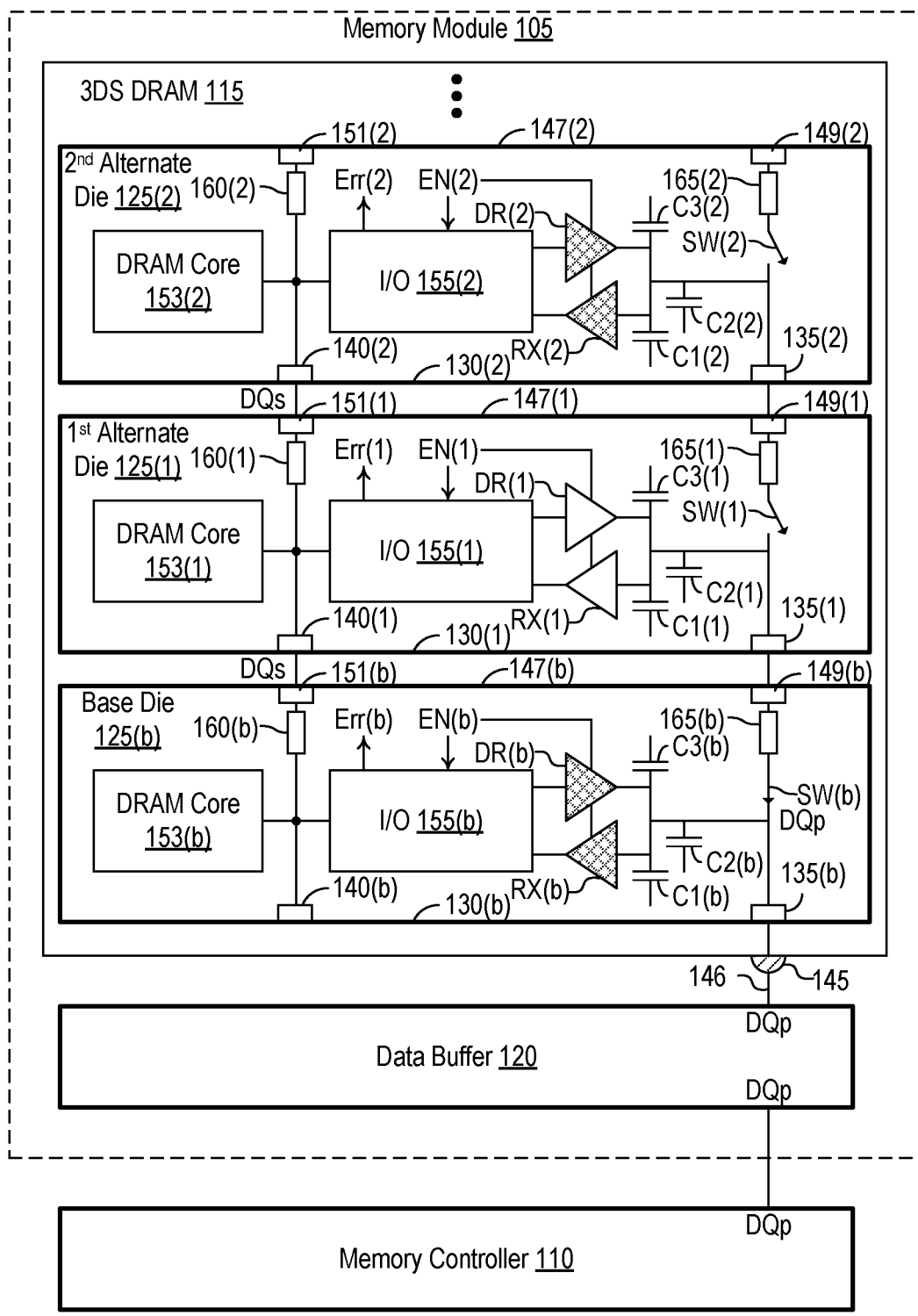
FIG. 2 depicts memory system 100 of FIG. 1 configured as though the primary data I/O in base die 125($b$) is disabled by deasserting signal EN(b), a condition illustrated by shading driver/receiver pair DR(b)/RX(b).

FIG. 2 depicts memory system 100 of FIG. 1 configured as though the primary data I/O in base die 125(*b*) is disabled by deasserting signal EN(b), a condition illustrated by shading driver/receiver pair DR(b)/RX(b). Memory controller 110 can assert or deassert enable signals EN(#) by writing to control registers (not shown) in dies 125(#). Closing switch SW(b) connects bottom base-die primary data contact 135(*b*) to bottom alternate-die primary data contact 135(1). Enable signal EN(1) is asserted to enable I/O circuit 155(1) and driver/receiver pair DR(1)/RX(1) to serve as primary data interface for DRAM device 115.

Closing switch SW(b) connects capacitances C1(1), C2(1), and C2(2) to primary data contact 135, and thus increases the capacitive loading on primary data contact 135(*b*). The effect of this increased capacitive loading on speed performance is reduced, however, by deasserting enable signal EN(b) to disable the driver/receiver (DB(b)/RX(b)) pair in base die 125(*b*), and thus reduce the values of capacitances C1(*b*) and C3(*b*). Power consumption is also reduced for both the driver/receiver (DR(b)/RX(b)) pair and I/O circuit 155(*b*). Thus configured, DRAM device 115 is retested and its timing calibrated using first alternative die 125(1) to support the external data interface to data buffer 120 on behalf of all DRAM cores 153(#). If the I/O circuitry in first alternative die 125(1) should likewise fail, it too can be disabled in favor of the I/O circuitry within second alternative die 125(2). The same holds for other alternative dies (not shown) in the stack.

Figure 3:
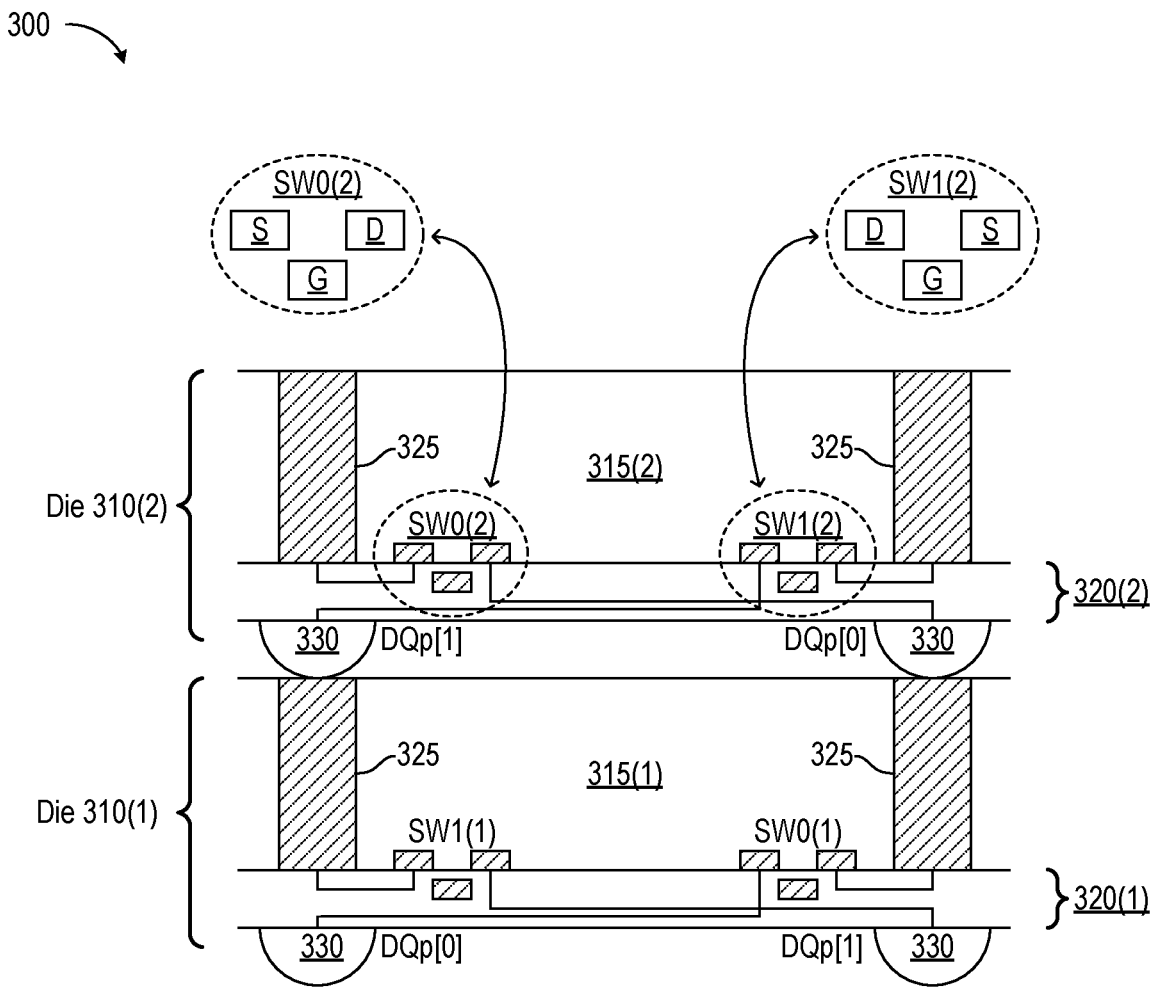
FIG. 3 depicts a memory device 300 with a pair of stacked dies 310(1) and 310(2) that incorporate switched connections and TSVs to manage primary data communication in accordance with one embodiment.

FIG. 3 depicts a memory device 300 with a pair of stacked dies 310(1) and 310(2) that incorporate switched connections and TSVs to manage primary data communication in accordance with one embodiment. Each die 310(#) includes a semiconductor (silicon) portion 315(#) and a signal redistribution layer 320(#), the latter with signal traces that facilitate lateral signal flow between the dies. Switches SW0(#) and SW1(#), each drawn as a transistor with source (S), gate (G), and drain (D) nodes, serve respective primary data terminals DQp[0] and DQp[1] by selectively guiding data signals to TSVs 325 that extend through the silicon portions 315(#). Control elements for these switches can be integrated within portions 315(#) and 320(#).

Each redistribution layer 320(#) has metallization patterns that provide signal paths and can be applied to either surface of silicon portion 315(#). Landing bumps, not shown, provide physical and electrical connections to micro bumps 330 that interconnect the dies. The metallization patterns in redistribution layers 320(#) can be implemented in silicon interposers in other embodiments, essentially silicon PCBs that can be added to silicon portions 315(#).

Figure 4:
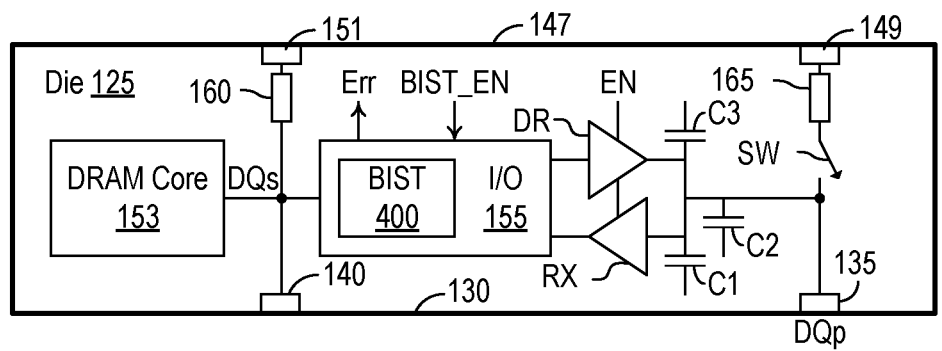
FIG. 4 depicts one of dies 125 introduced in FIG. 1. I/O circuit 155 includes BIST circuitry 400 that allows die 125 to test I/O circuit 155, driver DR, receiver RX, and related connections.

FIG. 4 depicts one of dies 125 introduced in FIG. 1. I/O circuit 155 includes BIST circuitry 400 that allows die 125 to test I/O circuit 155, driver DR, receiver RX, and related connections. BIST circuitry 400 outputs an error signal Err. Signal EN is deasserted to disable I/O circuit 155, driver DR, and receiver RX by shutting down an internal clock signal that times data transfers. During test, BIST circuitry 400 generates pseudo-random test patterns to read from and write to DRAM core 153. BIST circuitry 400 can also perform a loop-back test in which test signals are transmitted through driver DR and received back via receiver RX. BIST circuitry 400 verifies the accuracy of these communications and, if erroneous, issues error signals on node Err. A memory controller (FIG. 1) monitors error signal Err and error correction bits associated with data transfers. The memory controller can cause enable signal EN and a BIST-enable signal BIST_EN to be asserted or deasserted by issuing a command to die 125. The memory controller can also perform other types of tests by e.g. scanning memory addresses in DRAM core 153. A subset of the external connections (e.g. data connections DQp of FIG. 1) showing persistent failure regardless of the die being addressed is indicative of a device I/O failure. These tests can likewise be performed for other dies in a 3DS stack.

While the present invention has been described in connection with specific embodiments, variations of these embodiments will be obvious to those of ordinary skill in the art. For example, some components are shown directly connected to one another while others are shown connected via intermediate components. In each instance the method of interconnection establishes some desired electrical communication between two or more circuit nodes, or terminals. Such interconnection may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. § 112.

What is claimed is:

1. A memory device comprising:
   a base memory die having:
      a bottom base-die face including a bottom base-die primary data contact;
      a top base-die face extending through the three-dimensional memory device and including a top base-die primary data contact and a top base-die secondary data contact;
      a switchable connection between the bottom base-die primary data contact and the top base-die primary data contact;
      base-die drive circuitry having a drive-circuitry input coupled to the top base-die secondary data contact and a drive-circuitry output coupled to the bottom base-die primary data contact; and
      a base-die memory core coupled to the drive-circuitry input; and
   an alternate memory die affixed atop the base memory die, the alternate memory die having:
      a bottom alternate-die face extending through the three-dimensional memory device adjacent the top base-die face, the bottom alternate-die face including a bottom alternate-die primary data contact in contact with the top base-die primary data contact and a bottom alternate-die secondary data contact in contact with the top base-die secondary data contact; and
      an alternate-die memory core coupled to the drive-circuitry input via the bottom alternate-die secondary data contact and the top base-die secondary data contact.

2. The memory device of claim 1, the base-die drive circuitry including a serializer coupled between the top base-die secondary data contact and the bottom base-die primary data contact.

3. The memory device of claim 2, the base-die drive circuitry including an enable terminal to receive an enable signal, the base-drive circuitry exhibiting a first output capacitance when the enable signal asserted and a lower second output capacitance when the enable signal is deasserted.

4. The memory device of claim 1, the base memory die including second base-die drive circuitry having a second drive-circuitry output coupled to the top base-die secondary data contact and a second drive-circuitry input coupled to the bottom base-die primary data contact.

5. The memory device of claim 4, the second base-die drive circuitry including a deserializer coupled between the bottom base-die primary data contact and the top base-die secondary data contact.

6. The memory device of claim 1, wherein at least one of the base-die memory core and the alternate-die memory core comprises dynamic, random-access memory.

7. The memory device of claim 1, further comprising a register to close the switchable connection between the bottom base-die primary data contact and the top base-die primary data contact to connect the bottom alternate-die primary data contact to the bottom base-die primary data contact.

8. The memory device of claim 1, further comprising a data-buffer integrated circuit affixed to the bottom base-die face, the data-buffer integrated circuit to communicate read data from the bottom base-die primary data contact.

9. The memory device of claim 1, the alternate memory die including a top alternate-die face having a top alternate-die primary data contact and a second switchable connection between the bottom alternate-die primary data contact and the top alternate-die primary data contact.

10. The memory device of claim 9, the alternate memory die including alternate-die drive circuitry having an alternate-die drive-circuitry input coupled to alternate-die memory core and an alternate-die drive-circuitry output coupled to the bottom alternate-die primary data contact.

11. The memory device of claim 1, the base memory die further including an enable node coupled to the base-die drive circuitry, the enable node to enable the base-die drive circuitry responsive to an enable signal.

12. The memory device of claim 11, wherein the enable signal opens the switchable connection.

13. A memory module comprising:
   a printed-circuit board;
   a base memory die including:
      a bottom base-die face including a bottom base-die primary data contact electrically connected to the printed-circuit board;
      a top base-die face including a top base-die primary data contact and a top base-die secondary data contact;
      a switchable connection between the bottom base-die primary data contact and the top base-die primary data contact;
      base-die drive circuitry having a drive-circuitry input coupled to the top base-die secondary data contact and a drive-circuitry output coupled to the bottom base-die primary data contact; and
      a base-die memory core coupled to the drive-circuitry input; and
   an alternate memory die affixed atop the base memory die, the alternate memory die including:
      a bottom alternate-die face adjacent the top base-die face, the bottom alternate-die face including a bottom alternate-die primary data contact in contact with the top base-die primary data contact and a bottom alternate-die secondary data contact in contact with the top base-die secondary data contact; and
      an alternate-die memory core coupled to the drive-circuitry input via the bottom alternate-die secondary data contact and the top base-die secondary data contact.

14. The memory module of claim 13, the base-die drive circuitry including a serializer coupled between the top base-die secondary data contact and the bottom base-die primary data contact.

15. The memory module of claim 14, the base-die drive circuitry including an enable terminal to receive an enable signal, the base-drive circuitry exhibiting a first output capacitance when the enable signal asserted and a lower second output capacitance when the enable signal is deasserted.

16. The memory module of claim 13, the base memory die including second base-die drive circuitry having a second drive-circuitry output coupled the top base-die secondary data contact and a second drive-circuitry input coupled to the bottom base-die primary data contact.

17. The memory module of claim 16, the second base-die drive circuitry including a deserializer coupled between the bottom base-die primary data contact and the top base-die secondary data contact.

18. The memory module of claim 13, wherein at least one of the base-die memory core and the alternate-die memory core comprises dynamic random-access memory.

19. The memory module of claim 13, further comprising a register to close the switchable connection between the bottom base-die primary data contact and the top base-die primary data contact to connect the bottom alternate-die primary data contact to the bottom base-die primary data contact.

* * * * *